US008462140B2

(12) United States Patent
Hsu et al.

(10) Patent No.: US 8,462,140 B2
(45) Date of Patent: Jun. 11, 2013

(54) ELECTRONIC APPARATUS HAVING A STYLUS WITH A CORD RETRACTOR CONNECTED THERETO AND AN ASSEMBLY OF A CORD RETRACTOR AND A STYLUS

(75) Inventors: Po-Yuan Hsu, Taipei (TW);
Hsing-Wang Chang, Taipei (TW);
Chia-Cheng Su, Taipei (TW);
Wei-Chen Wang, Taipei (TW);
Tsung-Hsien Chen, Taipei (TW)

(73) Assignee: Wistron Corporation, Taipei Hsien (TW)

( * ) Notice: Subject to any disclaimer, the term of this patent is extended or adjusted under 35 U.S.C. 154(b) by 334 days.

(21) Appl. No.: 12/901,145

(22) Filed: Oct. 8, 2010

(65) Prior Publication Data
US 2011/0188184 A1    Aug. 4, 2011

(30) Foreign Application Priority Data

Feb. 3, 2010    (TW) .............................. 99202216 U

(51) Int. Cl.
*G06F 3/033*    (2006.01)

(52) U.S. Cl.
USPC ...................................... 345/179; 178/18.01

(58) Field of Classification Search
USPC ......... 345/179; 361/679.01; 242/379; 178/18
See application file for complete search history.

(56) References Cited

U.S. PATENT DOCUMENTS

| 5,004,870 | A  | * | 4/1991 | Osborn ...................... 178/18.01 |
| 5,200,913 | A  | * | 4/1993 | Hawkins et al. ......... 361/679.09 |
| 5,756,941 | A  | * | 5/1998 | Snell .......................... 178/19.01 |
| 7,050,041 | B1 | * | 5/2006 | Smith et al. ................... 345/156 |
| 7,242,394 | B2 | * | 7/2007 | Lahade et al. ................ 345/173 |
| 2009/0153524 | A1 |   | 6/2009 | Tang et al. |

* cited by examiner

*Primary Examiner* — Sang Kim
(74) *Attorney, Agent, or Firm* — Steptoe & Johnson LLP

(57) ABSTRACT

An electronic apparatus includes a machine body, a stylus, and a cord retractor. The machine body includes a housing and an electronic component module mounted in the housing. The cord retractor includes an inner axle mounted in one of the stylus and the housing, a spool rotatably sleeved around the inner axle, a biasing component mounted between the inner axle and the spool, and having a pair of ends connected respectively to the inner axle and the spool such that the spool is operated to rotate resiliently relative to the inner axle, and a connecting cord wound around the spool and that may be unwound therefrom, and having a first end connected to the housing and a second end connected to the stylus. An assembly of a cord retractor and a stylus is also disclosed.

14 Claims, 6 Drawing Sheets

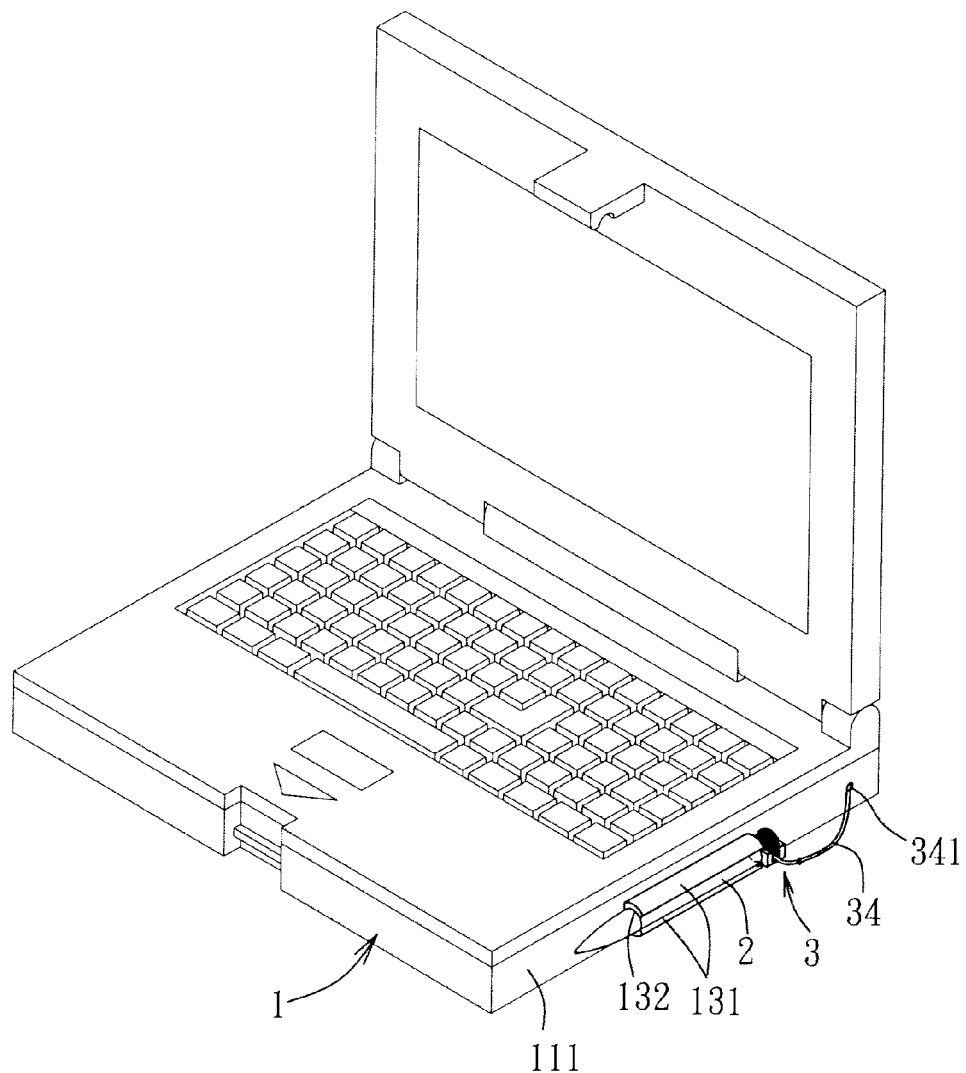
F I G. 5

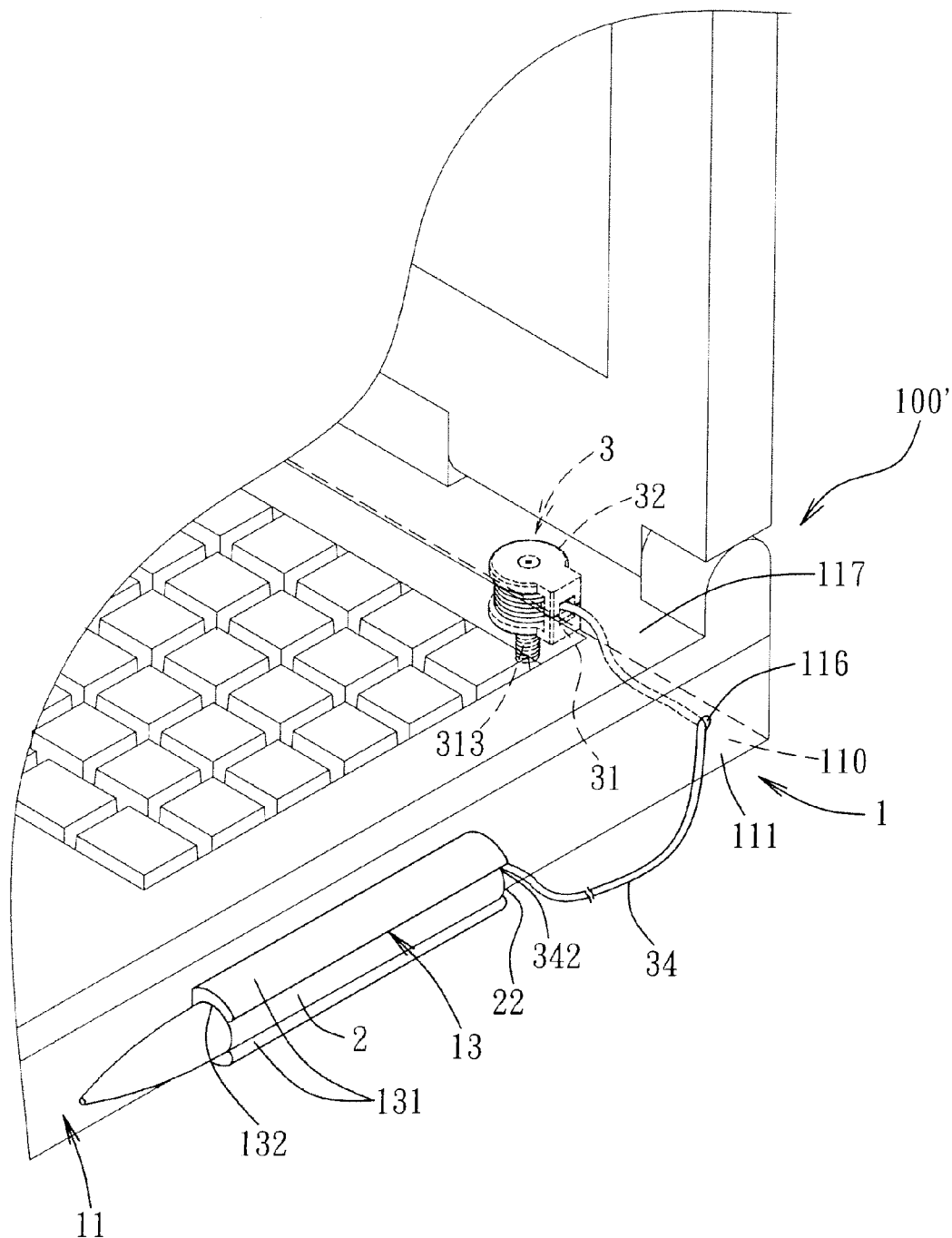
F I G. 7

ELECTRONIC APPARATUS HAVING A STYLUS WITH A CORD RETRACTOR CONNECTED THERETO AND AN ASSEMBLY OF A CORD RETRACTOR AND A STYLUS

CROSS-REFERENCE TO RELATED APPLICATION

This application claims priority of Taiwanese Application No. 099202216, filed on Feb. 3, 2010.

BACKGROUND OF THE INVENTION

1. Field of the Invention

The present invention relates to an electronic apparatus with a stylus, and more particularly, to an electronic apparatus having a stylus with a cord retractor connected thereto.

2. Description of the Related Art

An electronic apparatus with a touchscreen (for example, a personal digital assistant, a notebook computer, an electronic dictionary, etc.) is typically provided with a stylus which is received in the body of the electronic apparatus to provide for user convenience. The user can remove the stylus when desiring to operate the electronic apparatus using the touchscreen. When not in use, the stylus may be received back in the body of the electronic apparatus. US Patent Application Publication No. 2009/0153524 discloses a configuration for accommodating and positioning a stylus in the body of an electronic apparatus.

SUMMARY OF THE INVENTION

A stylus and an electronic apparatus are typically provided as independent and separate components, and the stylus is generally received in the electronic apparatus utilizing simply a configuration that allows for insertion of the stylus therein. If the stylus is not replaced back into the electronic apparatus after use of the same, the stylus is easily lost. With this in mind, therefore, the object of the present invention is to provide an electronic apparatus having a stylus with a cord retractor connected thereto, and an assembly of a cord retractor and a stylus that is mounted to an electronic apparatus.

According to one aspect, the electronic apparatus of this invention comprises a machine body, a stylus, and a cord retractor. The machine body includes a housing, and an electronic component module mounted in the housing. The cord retractor includes an inner axle mounted in one of the stylus and the housing, a spool rotatably sleeved around the inner axle, a biasing component mounted between the inner axle and the spool, and having a pair of ends connected respectively to the inner axle and the spool such that the spool is operated to rotate resiliently relative to the inner axle, and a connecting cord wound around the spool and that may be unwound therefrom, and having a first end connected to the housing and a second end connected to the stylus.

According to another aspect, the assembly of a cord retractor and a stylus of this invention is adapted to be mounted on an electronic apparatus. The assembly comprises: a stylus; and a cord retractor including an inner axle, a spool, a biasing component, and a connecting cord. The inner axle is mounted in one of the stylus and the electronic apparatus. The spool is rotatably sleeved around the inner axle. The biasing component is mounted between the inner axle and the spool, and has a pair of ends connected respectively to the inner axle and the spool such that the spool is operated to rotate resiliently relative to the inner axle. The connecting cord is wound around the spool and may be unwound therefrom, and has a first end connected to the electronic apparatus and a second end connected to the stylus.

The advantage of this invention resides in that, through the coupling between the stylus and the electronic apparatus using the cord retractor, the problem of the stylus easily getting lost when it is not being used after it is extracted from the electronic apparatus is solved. Moreover, utilizing the retracting mechanism of the cord retractor, the connecting cord that interconnects the stylus and the electronic apparatus is easily retracted, thereby preventing tangling of the connecting cord which would result in inconvenience during use.

BRIEF DESCRIPTION OF THE DRAWINGS

Other features and advantages of the present invention will become apparent in the following detailed description of the preferred embodiment with reference to the accompanying drawings, of which:

FIG. 5 is a perspective view of the first preferred embodiment, illustrating the stylus in a state received in a first configuration of a positioning structure;

FIG. 7 is a fragmentary perspective view of an electronic apparatus having a stylus with a cord retractor connected thereto according to a second preferred embodiment of the present invention.

DETAILED DESCRIPTION OF THE PREFERRED EMBODIMENTS

Preferred embodiments of the present invention will now be described with reference to the accompanying drawings.

Figure 1:
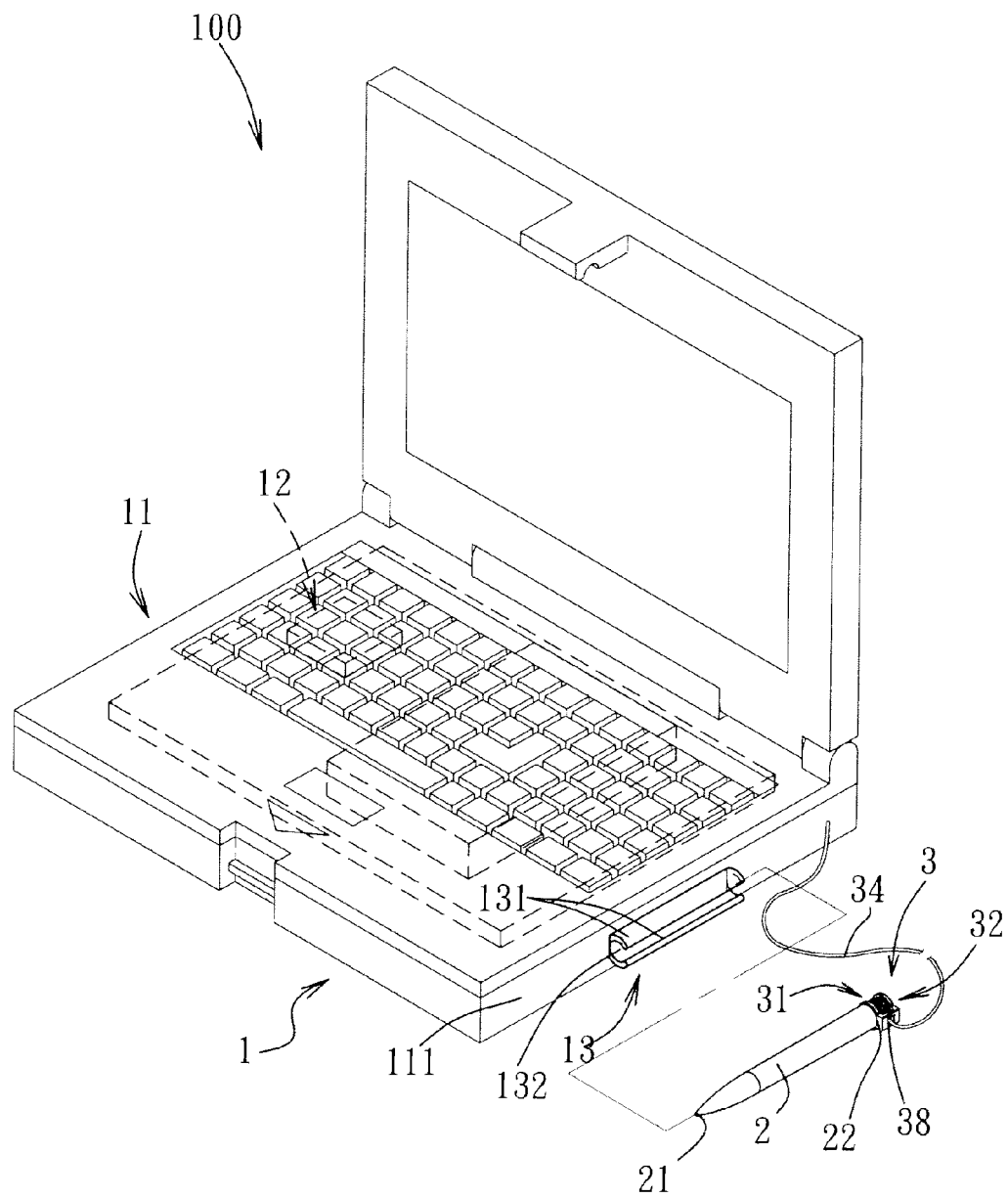
FIG. 1 is a perspective view of an electronic apparatus having a stylus with a cord retractor connected thereto according to a first preferred embodiment of the present invention.
Figure 2:
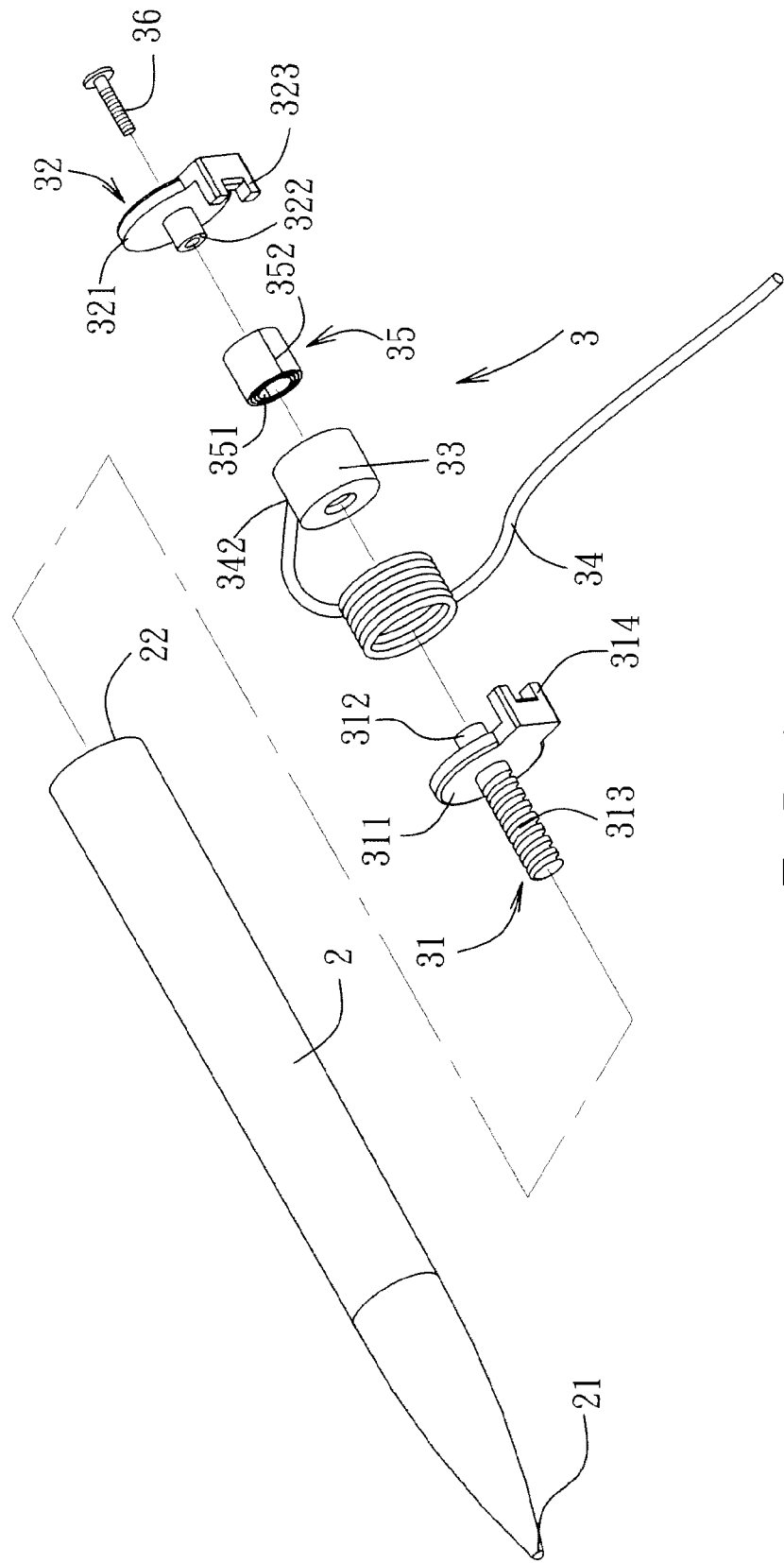
FIG. 2 is an exploded perspective view of a stylus and a cord retractor of the first preferred embodiment.
Figure 3:
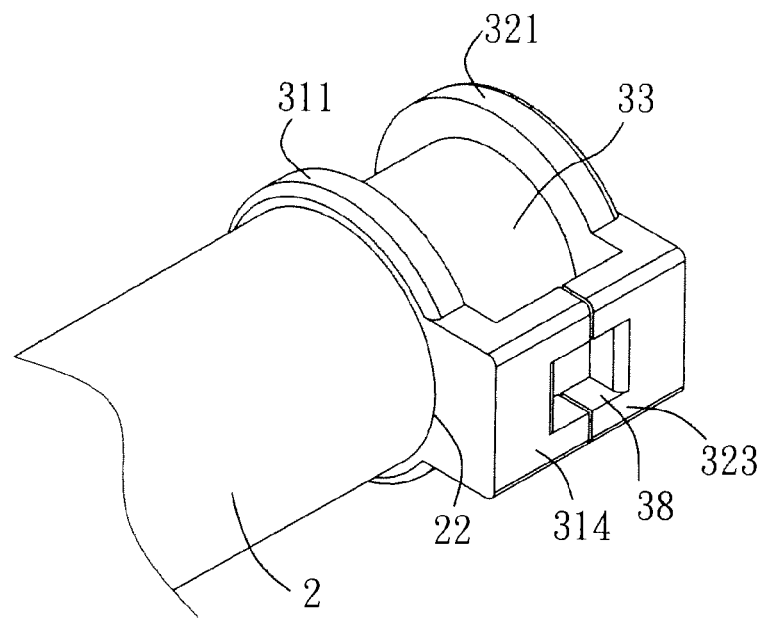
FIG. 3 is a fragmentary perspective view of the stylus and the cord retractor of the first preferred embodiment in an assembled state.

Referring to FIG. 1, an electronic apparatus 100 according to a first preferred embodiment of the present invention comprises a machine body 1, a stylus 2, and a cord retractor 3.

The machine body 1 includes a housing 11, an electronic component module 12 mounted in the housing 11, and a positioning structure 13 mounted on the housing 11. In this embodiment, the electronic apparatus 100 is a notebook computer, and hence, the aforementioned housing 11 is the housing of the notebook computer, and the aforementioned electronic component module 12 includes, for example, a motherboard, a central processing unit mounted on the motherboard, a hard disk, and a touch control panel connected electrically to the motherboard, etc. However, the electronic apparatus 100 of this invention is not to being a notebook computer, and may instead be a mobile phone, a personal digital assistant (PDA), an electronic dictionary, etc.

The positioning structure 13 is mounted on the housing 11 and defines an accommodation groove 132. In this embodiment, the positioning structure 13 includes a pair of arcuate positioning plates 131 mounted protruding from a lateral edge 111 of the housing 11 in a state vertically spaced apart from each other and with ends that oppose one another. The positioning plates 131 may be made of a plastic material with a small degree of deformable resiliency, and cooperate to define the accommodation groove 132 which is approximately cylindrical in shape and extends along a direction that is parallel to the direction along which the lateral edge 111 extends.

Figure 4:
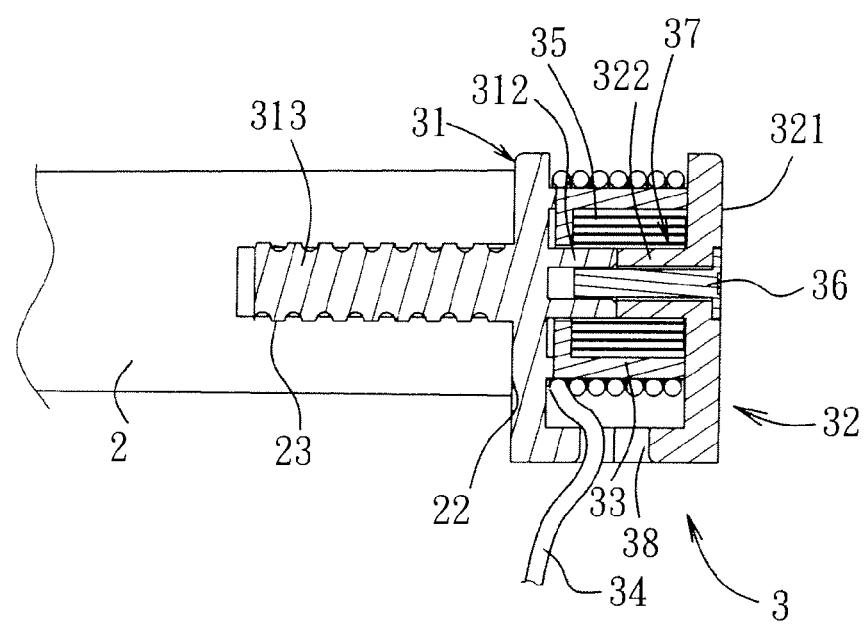
FIG. 4 is a fragmentary sectional view of the cord retractor and the stylus of the first preferred embodiment in an assembled state.

The stylus 2 has a bottom end 21 and a top end 22. Preferably, the bottom end 21 is tapered to provide for good point contact on the touch control panel. The top end 22 of the stylus 2 is formed with an inner threaded hole 23 (see FIG. 4). The stylus 2 may be received in the accommodation groove 132 (see FIG. 5), at which time the positioning plates 131 are used to clasp the stylus 2 so as to position the same to the lateral edge 111 of the housing 11.

Referring to FIGS. 2 to 5, in this embodiment, the cord retractor 3 is disposed on the top end 22 of the stylus 2 and includes a bottom seat 31, a top seat 32, a spool 33, a connecting cord 34, and a biasing component 35. The bottom seat 31 includes a bottom plate 311, a lower axle section 312 protruding upwardly from the bottom plate 311, a threaded bolt section 313 extending downwardly from the bottom plate 311, and a lower notched structure 314 connected to a lateral edge of the bottom plate 311, extending upwardly, and formed with a notch that opens upwardly. The top seat 32 includes a top plate 321, an upper axle section 322 protruding downwardly from the top plate 321, and a upper notched structure 323 connected to a lateral edge of the top plate 321, extending downwardly, and formed with a notch that opens downwardly. The bottom seat 31 is secured to the top end 22 of the stylus 2 by means of the threaded bolt section 313 extending into and engaging the inner threaded hole 23 formed in the top end 22 of the stylus 2. The top seat 32 is fixed to the bottom seat 31 by a fastener 36. When the top seat 32 is secured to the bottom seat 31, the upper axle section 322 of the top seat 32 and the lower axle section 312 of the bottom seat 31 abut against each other and thereby cooperate to form an inner axle 37 between the top plate 321 and the bottom plate 311. Moreover, in this state, the notches of the upper and lower notched structures 323, 314 are aligned to thereby cooperate to form an opening 38. The spool 33 is a hollow cylindrical structure that is sleeved around the inner axle 37 and is disposed between the top plate 321 and the bottom plate 311. The spool 33 is rotatable about the inner axle 37. The connecting cord 34 has a first end 341 and a second end 342. The first end 341 of the connecting cord 34 is connected fixedly to the housing 11, and the second end 342 of the connecting cord 34 is connected fixedly to the spool 33, such that when the spool 33 is rotated relative to the inner axle 37, the connecting cord 34 moves therewith to thereby be wound around the spool 33.

In this embodiment, the biasing component 35 is a plate-type volute spiral spring and includes an inner end 351 and an outer end 352. In ether embodiments, the biasing component 35 is a spiral torsion spring. The biasing component 35 is sleeved on the inner axle 37, with the inner end 351 thereof being fixed to the inner axle 37 and the outer end 352 thereof being fixed to the spool 33. Moreover, in this embodiment, the biasing component 35 is configured and mounted such that when the connecting cord 34 is extended and not wound around the spool 33, the biasing component 35 is in a wound state storing a resilient restorative force. When the force for extending the connecting cord 34 is no longer present, the resilient restorative force of the biasing component 35 drives the spool 33 to rotate relative to the inner axle 37 so as to pull the connecting cord 34 and wind the same around the spool 33.

Therefore, when the stylus 2 is not in use as shown in FIG. 5, the stylus 2 can be positioned between the positioning plates 131 by being extended into the accommodation groove 132. In this state, the connecting cord 34 receives the winding biasing force of the biasing component 35 so as to be wound around the spool 33. When the stylus 2 is needed and therefore extracted from the accommodation groove 132 and pulled away from the housing 11 as shown in FIG. 1, the connecting cord 34 is unwound from the spool 33. Unwinding the connecting cord 34 from the spool 33 is realized by rotation of the spool 33 relative to the inner axle 37 as the connecting cord is pulled, and this in turn causes the biasing component 35 to wind and to store the resilient restorative force.

When the user no longer requires use of the stylus 2 and moves the stylus 2 near the housing 11 with the intention of inserting the same into the accommodation groove 132, the resilient restorative force of the biasing component 35 rotates the spool 33 relative to the inner axle 37 and thereby winds the connecting cord 34 back around the spool 33.

In summary, through the assembly of the stylus 2 and the cord retractor 3, and through the formation as a single unit of the stylus 2 and the housing 11 of the electronic apparatus 100 by the cord retractor 3, the prior art problem of the stylus 2 becoming easily lost after being removed from the housing 11 is overcome.

Figure 6:
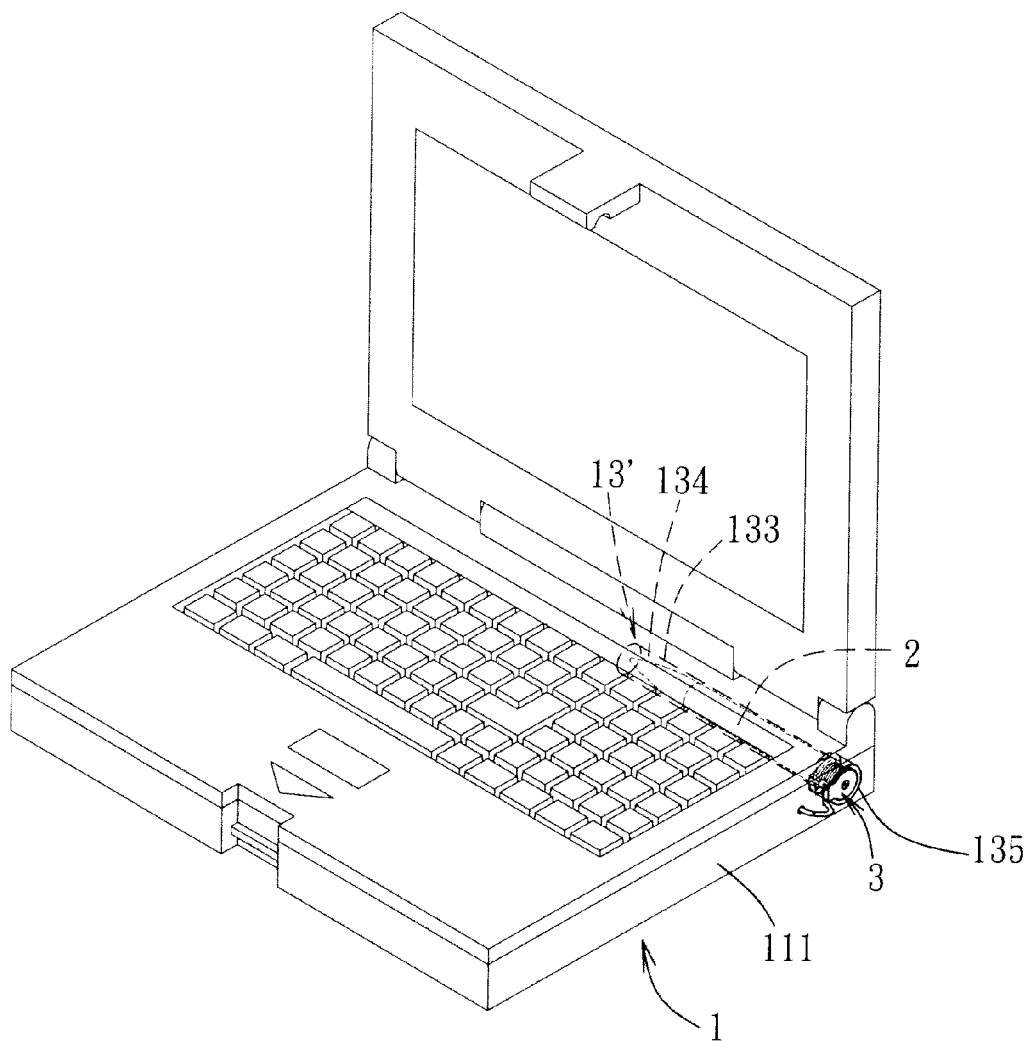
FIG. 6 is a perspective view of the first preferred embodiment, illustrating the stylus in a state received in a second configuration of the positioning structure.

FIG. 6 shows a second configuration of the positioning structure 13'. The positioning structure 13' includes an inner wall 134 located within the housing 11, and an insert hole 135 formed in the lateral edge 111 of the housing 11. The inner wall 134 defines an insertion groove 133 that is in the form of a columnar space. The insert hole 135 is in spatial communication with the insertion groove 133 so that the insertion groove 133 is formed as a concavity starting from the housing 11. The stylus 2 is inserted into the insertion groove 133 through the insert hole 135 to thereby be positioned within the housing 11.

FIG. 7 shows an electronic apparatus 100' according to a second preferred embodiment of the present invention.

The difference between the second preferred embodiment of this invention and the first preferred embodiment resides in the positioning of the cord retractor 3. In the second preferred embodiment, the cord retractor 3 also includes a bottom seat 31, a top seat 32, a spool (not shown), a biasing component (not shown), and a connecting cord 34. The structures and coupling relations of these components are the same as the first preferred embodiment, and also, the positioning structure 13 is identical to the positioning structure 13 of the first preferred embodiment. However, in the second preferred embodiment, the cord retractor 3 is mounted fixedly inside the housing 11. In the second preferred embodiment, for example, the cord retractor 3 is mounted fixedly in the housing 11 using a configuration in which the housing 11 further has a cover 117 and a bottom wall 110 that engage each other, an inner threaded hole (not shown) is formed in an inner lateral wall face of the bottom wall 110, and the cord retractor 3 is fastened fixedly and indirectly to the bottom wall 110 of the housing 11 by the extension of the threaded bolt section 313 of the bottom seat 31 into the inner threaded hole of the bottom wall 110 of the housing 11. Of course, the bottom seat 31 may be fixed to another location in the housing 11 utilizing another securing structure, or alternatively, the bottom seat 31 can be a structure integrally formed with the housing 11 inside the same.

Moreover, in the second preferred embodiment, the lateral edge 111 of the housing 11 is further formed with a wire outlet hole 116. The first end (not shown) of the connecting cord 34 is similarly connected to the spool 33 to thereby be fixed to the housing 11 through the cord retractor 3. The second end 342 of the connecting cord 34 extends out of the housing 11 through the wire outlet hole 116 and is connected to the top end 22 of the stylus 2.

When the stylus 2 is not in use, the stylus 2 is extended between the positioning plates 131. In this state, the connecting cord 34 is pulled by the resilient restorative force of the biasing component to be received in the housing 11 and wound around the spool. When the stylus 2 is extracted from the accommodation groove 132 and pulled away from the housing 11 in preparation for use of the same, the connecting cord 34 is pulled out from the housing 11. Subsequently, when the user no longer requires use of the stylus 2 and therefore moves the stylus 2 near the housing 11 with the intention of inserting the same into the accommodation groove 132, the connecting cord 34 is again pulled into the housing and wound around the spool by the resilient restorative force of the biasing component.

Of course, the positioning structure 13' of FIG. 6 may also be applied to the second preferred embodiment.

In summary, the present invention utilizes the cord retractor 3 to interconnect the stylus 2 and the housing 11 to thereby overcome the problem of the stylus 2 becoming easily lost when removed from the housing 11 and not in use so as to achieve the object of the present invention. Moreover, by utilizing the retracting mechanism of the cord retractor 3, convenient retracting of the connecting cord 34 into the housing 11 is possible, thereby preventing tangling of the connecting cord 34.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An electronic apparatus comprising: a machine body including a housing, and an electronic component module mounted in said housing; a stylus; and a cord retractor including an inner axle mounted in one of said stylus and said housing, a spool rotatably sleeved around said inner axle, a biasing component mounted between said inner axle and said spool, and having a pair of ends connected respectively to said inner axle and said spool, said spool being operated to rotate resiliently relative to said inner axle, and a connecting cord wound around said spool and that maybe unwound therefrom, and having a first end connected to said housing and a second end connected to said stylus;
wherein said cord retractor further includes a bottom seat and a top seat, said bottom seat being connected to one of said stylus and said housing and having a lower axle section protruding upwardly, said top seat being connected to said bottom seat and having an upper axle section protruding downwardly and abutting against said lower axle section, said upper axle section and said lower axle section cooperating to form said inner axle;
wherein said bottom seat further includes a bottom plate and a lower notched structure, said lower axle section protruding upwardly from said bottom plate, said lower notched structure being connected to a lateral edge of said bottom plate, extending upwardly, and being formed with a notch that opens upwardly, said top seat further including a top plate and an upper notched structure, said upper axle section protruding downwardly from said top plate, said upper notched structure being connected to a lateral edge of said top plate, extending downwardly, and being formed with a notch that opens downwardly, said lower and upper notched structures cooperating to define an opening for said connecting cord to extend through when said bottom seat and said top seat are coupled with each other, said spool being disposed between said top plate and said bottom plate.

2. The electronic apparatus as claimed in claim 1, wherein said stylus is formed with an inner threaded hole, said bottom seat further including a threaded bolt section extending downwardly from said bottom plate, said bottom seat being connected to said stylus by said threaded bolt section extending into and engaging said inner threaded hole.

3. The electronic apparatus as claimed in claim 1, wherein said stylus has a top end and a bottom end, said bottom seat being mounted fixedly to said top end of said stylus, said first end of said connecting cord being connected fixedly to said housing, said second end of said connecting cord being connected fixedly to said spool to connect to said stylus through said spool which is sleeved around said inner axle.

4. The electronic apparatus as claimed in claim 3, wherein said machine body further includes a positioning structure mounted on said housing, said positioning structure defining an accommodation groove for extension of said stylus thereinto to secure said stylus to said housing.

5. The electronic apparatus as claimed in claim 4, wherein said positioning structure includes a pair of generally arcuate positioning plates mounted on said housing and spaced apart from each other, said positioning plates cooperating to define said accommodation groove.

6. The electronic apparatus as claimed in claim 3, wherein said housing of said machine body is formed with an insertion groove for removable insertion of said stylus thereinto.

7. The electronic apparatus as claimed in claim 1, wherein said stylus has a top end and a bottom end, said bottom seat being mounted fixedly to said housing, said first end of said connecting cord being connected fixedly to said spool to connect to said housing through said spool which is sleeved around said inner axle, said second end of said connecting cord being connected fixedly to said top end of said stylus.

8. The electronic apparatus as claimed in claim 7, further comprising a positioning structure mounted on said housing, said positioning structure defining an accommodation groove for extension of said stylus thereinto to secure said stylus to said housing.

9. The electronic apparatus as claimed in claim 8, wherein said positioning structure includes a pair of generally arcuate positioning plates mounted on said housing and spaced apart from each other, said positioning plates cooperating to define said accommodation groove.

10. The electronic apparatus as claimed in claim 7, wherein said housing of said machine body is formed with an insertion groove for removable insertion of said stylus thereinto.

11. An assembly of a cord retractor and a stylus adapted to be mounted on an electronic apparatus, said assembly comprising: a stylus; and a cord retractor including an inner axle mounted in one of said stylus and said electronic apparatus, a spool rotatably sleeved around said inner axle, a biasing component mounted between said inner axle and said spool, and having a pair of ends connected respectively to said inner axle and said spool, said spool being operated to rotate resiliently relative to said inner axle, and a connecting cord wound around said spool and that may be unwound therefrom, and having a first end connected to said electronic apparatus and a second end connected to said stylus;

wherein said cord retractor further includes a bottom seat and a top seat, said bottom seat being connected to one of said stylus and said electronic apparatus and having a lower axle section protruding upwardly, said top seat being connected to said bottom seat and having an upper axle section protruding downwardly and abutting against said lower axle section, said upper axle section and said lower axle section cooperating to form said inner axle;

wherein said bottom seat further includes a bottom plate and a lower notched structure, said lower axle section protruding upwardly from said bottom plate, said lower notched structure being connected to a lateral edge of said bottom plate, extending upwardly, and being formed with a notch that opens upwardly, said top seat further including a top plate and an upper notched structure, said upper axle section protruding downwardly from said top plate, said upper notched structure being connected to a lateral edge of said top plate, extending downwardly, and being formed with a notch that opens downwardly, said lower and upper notched structures cooperating to confine an opening for said connecting cord to extend through when said top seat and said bottom seat are coupled with each other, said spool being disposed between said top plate and said bottom plate.

12. The assembly as claimed in claim 11, wherein said stylus is formed with an inner threaded hole, said bottom seat further including a threaded bolt section extending downwardly from said bottom plate, said bottom seat being connected to said stylus by said threaded bolt section extending into and engaging said inner threaded hole.

13. The assembly as claimed in claim 11, wherein said stylus has a top end and a bottom end, said bottom seat being mounted fixedly to said top end of said stylus, said first end of said connecting cord being connected fixedly to said electronic apparatus, said second end of said connecting cord being connected fixedly to said spool to be connected to said top end of said stylus through said spool which is sleeved around said inner axle.

14. The assembly as claimed in claim 11, wherein said stylus has a top end and a bottom end, said bottom seat being mounted fixedly to said electronic apparatus, said first end of said connecting cord being connected fixedly to said spool to be connected to said electronic apparatus through said spool which is sleeved around said inner axle, said second end of said connecting cord being connected fixedly to said top end of said stylus.

* * * * *